(12) United States Patent
Imanishi

(10) Patent No.: US 10,547,252 B2
(45) Date of Patent: Jan. 28, 2020

(54) SEMICONDUCTOR DEVICE AND POWER CONVERSION SYSTEM

(71) Applicant: Mitsubishi Electric Corporation, Tokyo (JP)

(72) Inventor: Motoki Imanishi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/378,743

(22) Filed: Apr. 9, 2019

(65) Prior Publication Data

US 2019/0379298 A1 Dec. 12, 2019

(30) Foreign Application Priority Data

Jun. 11, 2018 (JP) ................ 2018-110888

(51) Int. Cl.
| | |
|---|---|
| *H02M 7/537* | (2006.01) |
| *H01L 29/06* | (2006.01) |
| *H01L 29/78* | (2006.01) |
| *H01L 29/739* | (2006.01) |
| *H01L 29/20* | (2006.01) |
| *H01L 29/16* | (2006.01) |
| *H01L 29/778* | (2006.01) |
| *H02M 1/00* | (2006.01) |

(52) U.S. Cl.
CPC ........ *H02M 7/537* (2013.01); *H01L 29/0646* (2013.01); *H01L 29/1608* (2013.01); *H01L 29/2003* (2013.01); *H01L 29/7393* (2013.01); *H01L 29/778* (2013.01); *H01L 29/78* (2013.01); *H02M 2001/0003* (2013.01)

(58) Field of Classification Search
CPC ........... H02M 7/537; H02M 2001/003; H01L 29/0646; H01L 29/2003; H01L 29/1608; H01L 29/7393; H01L 29/778; H01L 29/78

See application file for complete search history.

(56) References Cited

U.S. PATENT DOCUMENTS

| | | | |
|---|---|---|---|
| 2015/0061067 A1* | 3/2015 | Kim ............... | H01L 29/872 257/475 |
| 2015/0255454 A1 | 9/2015 | Jonishi | |
| 2019/0222107 A1* | 7/2019 | Morokuma ......... | H02M 1/08 |

FOREIGN PATENT DOCUMENTS

JP 2015-170733 A 9/2015

* cited by examiner

*Primary Examiner* — Adolf D Berhane
(74) *Attorney, Agent, or Firm* — Studebaker & Brackett PC

(57) ABSTRACT

A first drive circuit is connected with a first power supply node and a first GND node. A second drive circuit is connected with a second power supply node and a second GND node electrically separated from the first power supply node and the first GND node, respectively. A PN junction portion is formed of a P type part electrically connected with the first GND node, and an N type part electrically connected with the second power supply node. A magnetic coupling element has a first conductor coil and a second conductor coil. The first conductor coil is electrically connected with output nodes of the first drive circuit. The second conductor coil is electrically connected with input nodes of the second drive circuit.

10 Claims, 6 Drawing Sheets

SEMICONDUCTOR DEVICE AND POWER CONVERSION SYSTEM

BACKGROUND OF THE INVENTION

Field of the Invention

The present invention relates to a semiconductor device and a power conversion system. More particularly, the present invention relates to a semiconductor device having a signal transmission function involving insulation and level shift, and a power conversion system using the same.

Description of the Background Art

In an inverter for DC/AC conversion or the like, a configuration referred to as totem-pole connection is generally used, in which semiconductor switching elements such as IGBTs (Insulated Gate Bipolar Transistor) or MOSFETs (Metal Oxide Semiconductor Field Effect Transistor) constituting an upper arm and a lower arm are connected in series between a high voltage-side power line and a low voltage-side power line.

In the configuration using the totem-pole connection, in order to drive a gate of a lower arm semiconductor switching element, a control signal based on a ground in common with that for the totem pole connection can be used. On the other hand, in order to drive a gate of an upper arm semiconductor switching element, insulation and level shift are required to input, to the gate, a potential higher than that at a connection point between the upper arm and the lower arm semiconductor switching elements.

Concerning the configuration of an HVIC (High Voltage Integrated Circuit) as an example of a semiconductor device for such an application, Japanese Patent Laying-Open No. 2015-170733 describes a configuration for securing both the breakdown voltage of an HVIC and the current capacity of a p-channel MOSFET.

In Japanese Patent Laying-Open No. 2015-170733, a signal transmission function involving insulation and level shift is implemented by adopting a configuration of inputting an output signal from a transistor driven with a low voltage, of a plurality of transistors arranged in a semiconductor device having a so-called junction isolation structure, to a transistor driven with a high voltage.

SUMMARY OF THE INVENTION

On the other hand, in a junction isolation-type configuration as in Japanese Patent Laying-Open No. 2015-170733, a signal is transmitted by switching on/off a transistor arranged at a boundary between a low voltage side and a high voltage side and driven with a high voltage. Thus, when a high voltage-side GND potential becomes lower than a low voltage-side GND potential (that is, becomes a negative potential), the transistor cannot be switched on/off, and thereby signal transmission may fail. Further, since the transistor transmits the signal by conduction (ON) and cutoff (OFF) on the high voltage side, heat may be generated due to an increase in power loss during driving at a high frequency. In addition, electromagnetic noise may be generated by switching on/off the transistor at a high frequency.

The present disclosure has been made to solve such a problem, and an object of the present disclosure is to secure a stable signal transmission function and suppress power loss and electromagnetic noise during driving at a high frequency, in a semiconductor device having a level shift function involving insulation.

According to an aspect of the present disclosure, a semiconductor device includes first and second signal output circuits, a PN junction portion, and a magnetic coupling element. The first signal output circuit is connected with a first power supply node and a first ground node. The second signal output circuit is connected with a second power supply node electrically separated from the first power supply node, and a second ground node electrically separated from the first ground node. The PN junction portion is formed of a P type part electrically connected with the first ground node, and an N type part electrically connected with the second power supply node. The magnetic coupling element has first and second conductor coils which are magnetically coupled with each other. The first conductor coil is electrically connected with an output side of the first signal output circuit. The second conductor coil is electrically connected with an input side of the second signal output circuit.

The foregoing and other objects, features, aspects and advantages of the present invention will become more apparent from the following detailed description of the present invention when taken in conjunction with the accompanying drawings

DESCRIPTION OF THE PREFERRED EMBODIMENTS

Figure 1:
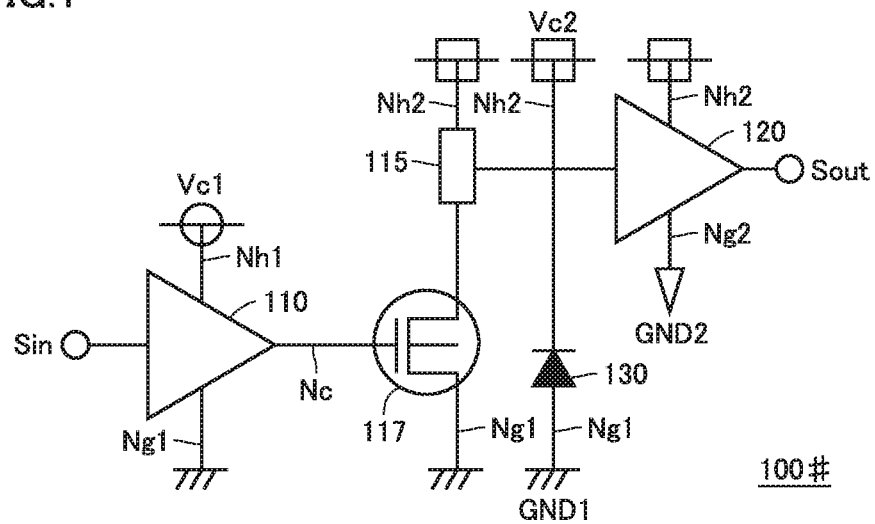
FIG. 1 is a block diagram illustrating a configuration of a semiconductor device in accordance with a comparative example.

Hereinafter, embodiments of the present disclosure will be described in detail with reference to the drawings. It should be noted that identical or corresponding parts in the drawings will be hereinafter designated by the same reference numerals, and the description thereof will not be repeated in principle.

First Embodiment

Description of Comparative Example

First, a configuration of a common junction isolation-type semiconductor device represented by Japanese Patent Laying-Open No. 2015-170733 will be described as a comparative example FIG. 1 is a block diagram illustrating a configuration of a semiconductor device 100# in accordance with a comparative example. As described below, semiconductor device 100# has a signal transmission function involving insulation and level shift.

Referring to FIG. 1, semiconductor device 100# in the comparative example includes a low voltage-side drive circuit 110 driven with a control power supply voltage Vc1, a resistive element 115, a high voltage switching element 117, a high voltage-side drive circuit 120 driven with a control power supply voltage Vc2, and a PN junction portion 130 for insulation between a high voltage and a low voltage. Representatively, each of drive circuits 110 and 120 is constituted of a current buffer (configured to maintain a voltage level between an input and an output) or an inverter (configured to reverse a voltage level between an input and an output).

Drive circuit 110 is connected with a low voltage-side power supply node Nh1 for transmitting control power supply voltage Vc1, and a low voltage-side GND node Ng1 (having a potential GND1). On the other hand, drive circuit 120 is connected with a high voltage-side power supply node Nh2 for transmitting control power supply voltage Vc2, and a high voltage-side GND node Ng2 (having a potential GND2).

Low voltage-side power supply node Nh1 and high voltage-side power supply node Nh2 are electrically separated. Similarly, low voltage-side GND node Ng1 and high voltage-side GND node Ng2 are also electrically separated. PN junction portion 130 is formed between high voltage-side power supply node Nh2 (an N side) and low voltage-side GND node Ng1 (a P side) to secure a breakdown voltage between a high voltage side and a low voltage side.

Resistive element 115 and high voltage switching element 117 are connected in series between high voltage-side power supply node Nh2 and low voltage-side GND node Ng1.

Drive circuit 110 receives a control signal Sin. Control signal Sin is a digital signal set to a logic high level (hereinafter referred to as an "H level") or a logic low level (hereinafter referred to as an "L level").

Drive circuit 110 sets the voltage of an output node Nc to Vc1 or GND1 according to the level of control signal Sin. Output node Nc of drive circuit 110 is connected to a gate of high voltage switching element 117. High voltage switching element 117 is switched on when the voltage of the gate relative to GND1 becomes higher than a threshold voltage, and is switched off otherwise. In the case where the threshold voltage is lower than Vc1, when drive circuit 110 outputs Vc1, the high voltage switching element is switched on. On the other hand, when drive circuit 110 outputs GND1, the gate voltage becomes zero and high voltage switching element 117 is switched off.

Accordingly, high voltage switching element 117 is switched on/off whenever the level of control signal Sin shifts. The amount of voltage drop in resistive element 115 when high voltage switching element 117 is switched on is different from that when it is switched off.

An input node of drive circuit 120 is electrically connected to resistive element 115 such that voltage changes between when high voltage switching element 117 is switched on and when it is switched off. Thus, an output of drive circuit 120 is set to Vc2 or GND2 according to switching on/off of high voltage switching element 117, namely, a change in the level of control signal Sin. Accordingly, as control signal Sin shifts between Vc1 (H level) and GND1 (L level), an output signal Sout shifts between Vc2 (H level) and GND2 (L level). As a result, in semiconductor device 100#, the signal transmission function involving insulation and level conversion is implemented by obtaining output signal Sout (Vc2/GND2) according to control signal Sin (Vc1/GND1).

Figure 2:
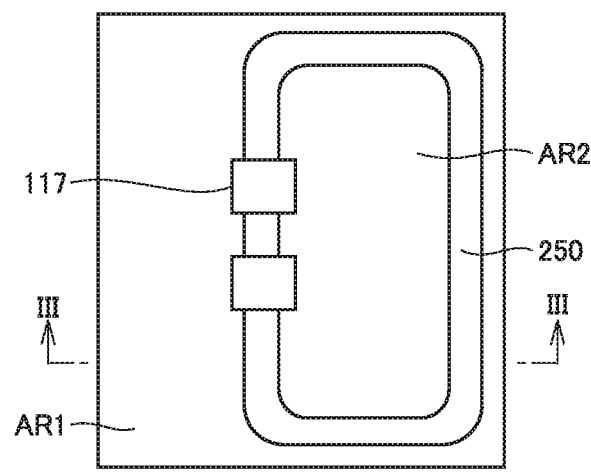
FIG. 2 is a schematic plan view of the semiconductor device shown in FIG. 1.

FIG. 2 is a schematic plan view of the semiconductor device shown in FIG. 1. FIG. 2 schematically shows a plan view in which a semiconductor substrate having semiconductor device 100# formed thereon is viewed from a main surface.

Referring to FIG. 2, a high voltage region AR2 and a low voltage region AR1 separated by an annular breakdown voltage holding portion 250 are formed in the main surface. Breakdown voltage holding portion 250 is made of an insulator, and is designed to have a breakdown voltage performance between control power supply voltages Vc1 and Vc2.

Drive circuit 110 in FIG. 1 is constituted using an element formed in low voltage region AR1. Similarly, low voltage-side power supply node Nh1 and low voltage-side GND node Ng1 are also formed in low voltage region AR1.

In contrast, drive circuit 120 in FIG. 1 is constituted using an element formed in high voltage region AR2. High voltage-side power supply node Nh2 and high voltage-side GND node Ng2 are also formed in high voltage region AR2.

High voltage switching element 117 in FIG. 1 is arranged to straddle breakdown voltage holding portion 250. In the exemplary configuration of FIG. 1, resistive element 115 is arranged in high voltage region AR2.

Figure 3:
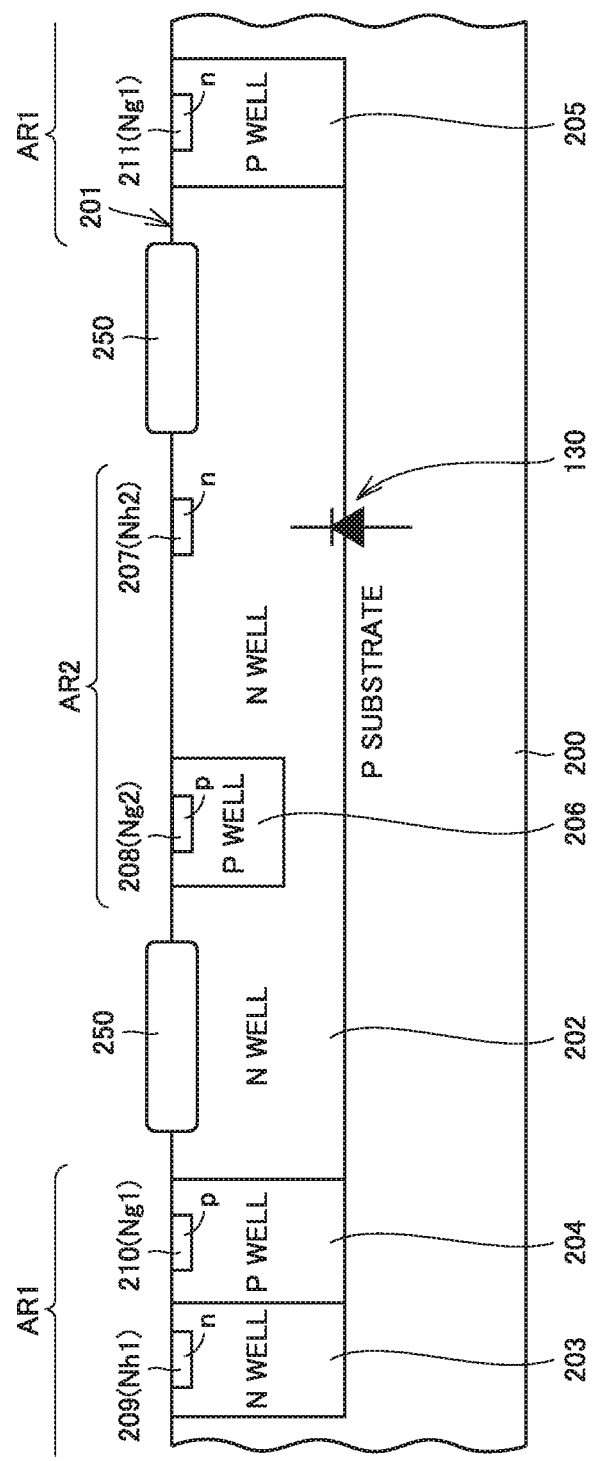
FIG. 3 is a schematic cross sectional view of the semiconductor device shown in FIG. 1.

FIG. 3 is a schematic cross sectional view of semiconductor device 100# shown in FIG. 1. FIG. 3 schematically shows a portion corresponding to a III-III cross section in FIG. 2.

Referring to FIG. 3, N wells 202 and 203 and P wells 204 and 205 are formed in a main surface 201 of a P type semiconductor substrate 200. Breakdown voltage holding portion 250 is formed in a surface of N well 202. Of N well 202, a region surrounded by annular breakdown voltage holding portion 250 forms high voltage region AR2. In high voltage region AR2, a P well 206 and an N type region 207 are further formed on a main surface side of N well 202. P well 206 is provided with an ungrounded P type region 208. P type region 208 forms high voltage-side GND node Ng2. N type region 207 is electrically connected with a supply circuit for control power supply voltage Vc2 (not shown), and forms high voltage-side power supply node Nh2.

N well 203, P well 204, and P well 205 outside annular breakdown voltage holding portion 250 are provided with an N type region 209, a P type region 210, and a P type region 211, respectively. Each of P type regions 210 and 211 is grounded, and forms low voltage-side GND node Ng1. N type region 209 is electrically connected with a supply circuit for control power supply voltage Vc1 (not shown), and forms low voltage-side power supply node Nh1.

Semiconductor substrate 200 (P type) and P type regions 210 and 211 have the same potential (GND1), and PN junction portion 130 shown in FIG. 1 is formed by a PN junction between semiconductor substrate 200 (P type) and N well 202.

In addition, high voltage-side GND node Ng2 (P type region 208) and low voltage-side GND node Ng1 (P type region 210, 211) are separated by a PN junction between P well 206 and N well 202, as well as a PN junction between N well 202 and each of P wells 204 and 205. By applying control power supply voltage Vc2 to N well 202 via N type region 207, each of these PN junctions is reversely biased, and thereby electrical insulation is established between high voltage-side GND node Ng2 and low voltage-side GND node Ng1.

According to semiconductor device 100# in the comparative example shown in FIGS. 1 to 3, the signal transmission function involving insulation and level shift is implemented by a junction isolation structure as in Japanese Patent Laying-Open No. 2015-170733, without using a photo coupler or a digital isolator.

When a photo coupler is used, there may occur a quality problem due to degradation of resin of an insulation portion, as well as a problem in terms of properties, such as a problem that power consumption should be increased to prevent erroneous light emission at a high temperature. In addition, when a digital isolator is used, there may occur an increase in manufacturing cost, because a semiconductor chip is configured to be separated between the low voltage side and the high voltage side. Therefore, these problems can be solved by using the junction isolation structure.

However, in semiconductor device 100# in the comparative example, signal transmission is performed by switching on/off high voltage switching element 117 by an output signal of low voltage-side drive circuit 110. Accordingly, when the potential of high voltage-side GND node Ng2 (GND2) becomes lower than the potential of low voltage-side GND node Ng1 (GND1), there is a possibility that high voltage switching element 117 cannot be switched on even though Vc1 is output from drive circuit 110. In this case, the signal transmission function may be lost because high voltage switching element 117 cannot be switched on/off.

In addition, when the frequency of control signal Sin is increased, the number of times high voltage switching element 117 is switched on/off is increased, which may cause reduction in efficiency due to an increase in power loss, generation of an excessively high temperature due to an increase in the amount of generated heat, and generation of electromagnetic noise. In the present embodiment, a configuration of a semiconductor device for solving these problems will be described.

Description of Present Embodiment

Figure 4:
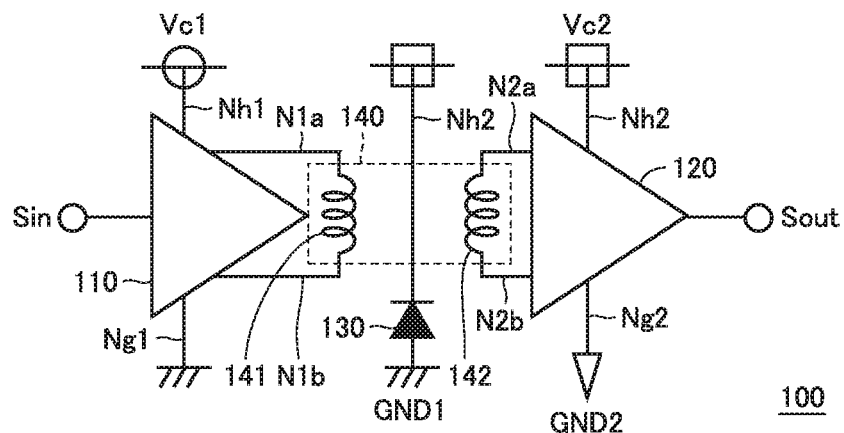
FIG. 4 is a block diagram illustrating a configuration of a semiconductor device in accordance with a first embodiment.

FIG. 4 is a block diagram illustrating a configuration of a semiconductor device in accordance with a first embodiment.

Referring to FIG. 4, a semiconductor device 100 in accordance with the first embodiment is different from semiconductor device 100# in the comparative example (FIG. 1) in that semiconductor device 100 includes a magnetic coupling element 140, instead of resistive element 115 and high voltage switching element 117. Semiconductor device 100 includes drive circuit 110, drive circuit 120, and PN junction portion 130 which are the same as those in FIG. 1.

As in FIG. 1, drive circuit 110 is connected with low voltage-side power supply node Nh1 (Vc1) and low voltage-side GND node Ng1 (GND1), and outputs a differential signal according to control signal Sin to between nodes N1a and N1b. For example, when control signal Sin is at an H level, drive circuit 110 outputs Vc1 to node N1a, and outputs GND1 to node N1b. In contrast, when control signal Sin is at an L level, drive circuit 110 outputs GND1 to node N1a, and outputs Vc1 to node N1b. In this manner, low voltage-side drive circuit 110 outputs Vc1 to one of nodes N1a and N1b, and outputs GND1 to the other of nodes N1a and N1b.

Magnetic coupling element 140 has a conductor coil 141 connected between nodes N1a and N1b, and a conductor coil 142 connected between nodes N2a and N2b. Conductor coils 141 and 142 are magnetically coupled, and a voltage change caused in conductor coil 141 is transmitted to conductor coil 142 by magnetic coupling. For example, the relation between positive and negative polarities of voltages at nodes N2a and N2b is the same as that at nodes N1a and N1b.

For example, when control signal Sin is at an H level, as Vc1 is output to node N1a and GND1 is output to node N1b on a low voltage side, node N2a has a potential higher than that of node N2b on an input side of high voltage-side drive circuit 120. In contrast, when control signal Sin is at an L level, node N2a has a potential lower than that of node N2b.

As in FIG. 1, high voltage-side drive circuit 120 is connected with high voltage-side power supply node Nh2 (Vc2) and high voltage-side GND node Ng2 (GND2). Drive circuit 120 sets output signal Sout to Vc2 (H level) or GND2 (L level) according to the voltage difference between nodes N2a and N2b. For example, when node N2a has a potential higher than that of node N2b, drive circuit 120 outputs Vc2 as output signal Sout. In contrast, when node N2a has a potential lower than that of node N2b, drive circuit 120 can output GND2 as output signal Sout.

As a result, in semiconductor device 100 in accordance with the first embodiment, a signal transmission function involving insulation and level conversion is implemented by obtaining output signal Sout (Vc2/GND2) according to control signal Sin (Vc1/GND1). It should be noted that, in the configuration of FIG. 4, drive circuit 110 corresponds to one embodiment of a "first signal output circuit", drive circuit 120 corresponds to one embodiment of a "second signal output circuit", nodes N1a and N1b correspond to an "output side of the first signal output circuit", and nodes N2a and N2b correspond to an "input side of the second signal output circuit". In addition, conductor coil 141 corresponds to a "first conductor coil", and conductor coil 142 corresponds to a "second conductor coil".

Figure 5:
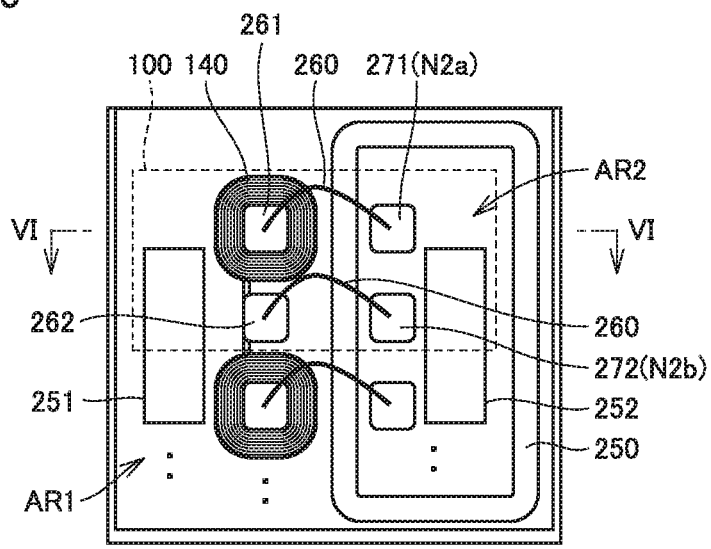
FIG. 5 is a schematic plan view of the semiconductor device shown in FIG. 4.

FIG. 5 is a schematic plan view of the semiconductor device shown in FIG. 4. FIG. 5 schematically shows a plan view in which a semiconductor substrate having a plurality of semiconductor devices 100 continuously formed thereon is viewed from a main surface.

Referring to FIG. 5, as in FIG. 2, high voltage region AR2 and low voltage region AR1 separated by annular breakdown voltage holding portion 250 are formed in the main surface Drive circuit 120 is constituted using a circuit element 252 formed in high voltage region AR2. Similarly, drive circuit 110 is constituted using a circuit element 251 formed in low voltage region AR1.

Magnetic coupling element 140 and conductor pads 261 and 262 are arranged in low voltage region AR1. Conductor pads 261 and 262 are electrically connected with one end and the other end of secondary conductor coil 142 (FIG. 4) of magnetic coupling element 140, respectively. Conductor pads 271 and 272 corresponding to input nodes of drive circuit 120 are formed in high voltage region AR2. Conductor pads 271 and 272 correspond to nodes N2a and N2b in FIG. 4, respectively.

Conductor pads 261 and 271 are electrically connected by a conductor 260, and conductor pads 262 and 272 are electrically connected by a conductor 260. Representatively, conductor 260 can be constituted of a wire.

Figure 6:
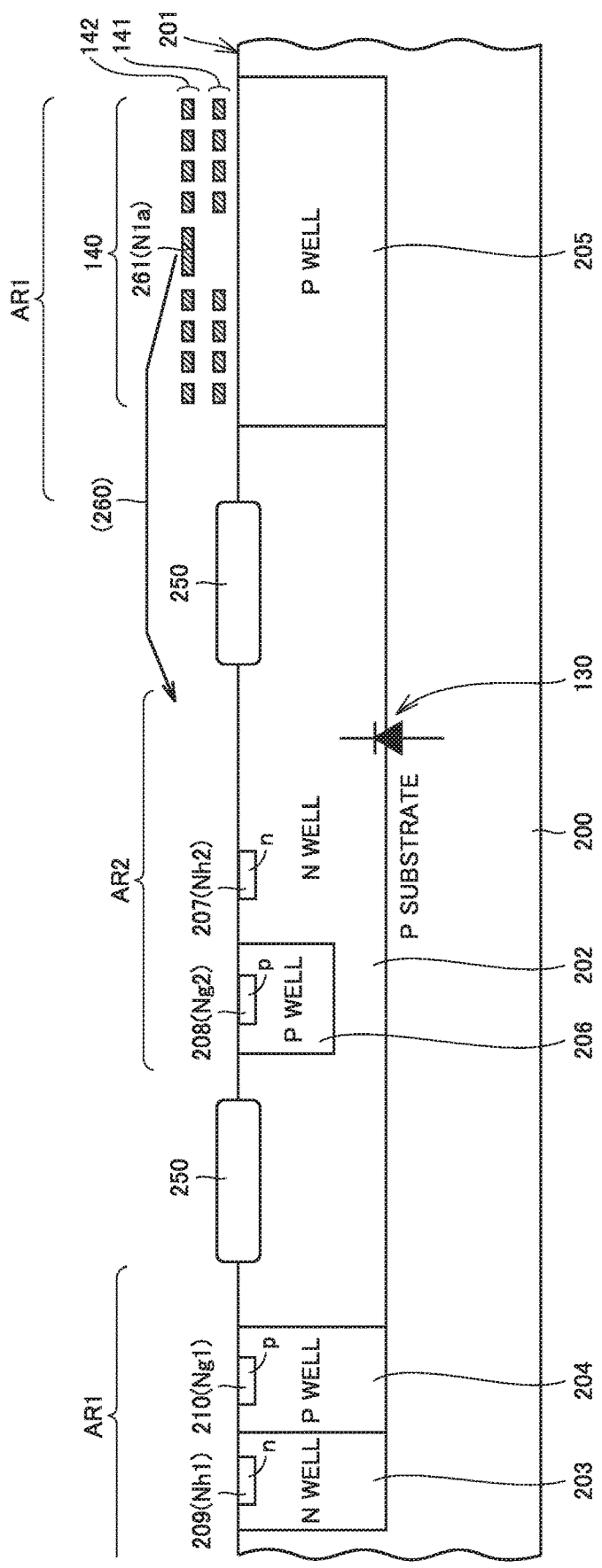
FIG. 6 is a schematic cross sectional view of the semiconductor device shown in FIG. 4.

FIG. 6 is a schematic cross sectional view of semiconductor device 100 shown in FIG. 4. Although FIG. 6 schematically shows a portion corresponding to a VI-VI cross section in FIG. 5, FIG. 6 does not show conductor pad 271 shown in FIG. 5.

Referring to FIG. 6, as in FIG. 3 (comparative example), N wells 202 and 203, P wells 204 to 206, N type regions 207 and 209, and P type regions 208 and 210 are provided in main surface 201 of P type semiconductor substrate 200.

Also in FIG. 6, P type region 208 is ungrounded and forms high voltage-side GND node Ng2, and P type region 210 is grounded and forms low voltage-side GND node Ng1. Similarly, N type region 207 is electrically connected with a supply circuit for control power supply voltage Vc2 (not shown), and forms high voltage-side power supply node Nh2. N type region 209 is electrically connected with a supply circuit for control power supply voltage Vc1 (not shown), and forms low voltage-side power supply node Nh1. Further, PN junction portion 130 shown in FIG. 1 is formed by a PN junction between semiconductor substrate 200 (P type) and N well 202.

Conductor coils 141 and 142 constituting magnetic coupling element 140 are arranged to be stacked in low voltage region AR1 on P well 205, to establish magnetic coupling therebetween. For example, conductor coils 141 and 142 can be formed using two wire layers adjacent in a vertical direction, of a plurality of wire layers formed by being stacked one after another on main surface 201.

Conductor coil 141 arranged on a lower side is electrically connected with a circuit element of drive circuit 110 formed on P well 205, of circuit element 251 (FIG. 5). Thereby, electrical connection between drive circuit 110 and conductor coil 141 via nodes N1a and N1b, as shown in FIG. 4, is secured.

One end of conductor coil 142 arranged on an upper side is electrically connected with conductor pad 261. The other end of conductor coil 142 is electrically connected with conductor pad 262 (FIG. 5). Thus, the voltage of a signal output from drive circuit 110 to nodes N a and N1b (conductor coil 141) passes through conductor pads 261, 262 and conductor 260, is transmitted to conductor pads 271, 272 (FIG. 5) formed within high voltage region AR2, and is input to drive circuit 120.

In the configuration of FIG. 6, a "P type part" is constituted of P type semiconductor substrate 200, and an "N type part" is formed of N well 202 having the same potential as that of N type region 207. Further, N type region 209 corresponds to a "first N type region", P type region 210 corresponds to a "first P type region", N type region 207 corresponds to a "second N type region", and P type region 208 corresponds to a "second P type region".

According to semiconductor device 100 in accordance with the first embodiment shown in FIGS. 4 to 6, as in semiconductor device 100# in the comparative example (FIGS. 1 to 3), the signal transmission function involving insulation and level shift can be implemented by a junction isolation structure, without using a photo coupler or a digital isolator.

Further, in semiconductor device 100 in accordance with the first embodiment, insulation and level shift functions can be provided using magnetic coupling element 140 formed on the semiconductor substrate, rather than a high voltage switching element (FIG. 1). Thereby, signal transmission can be performed without causing power loss associated with switching on/off, which has been caused in the high voltage switching element. Thus, even when control signal Sin has a high frequency, occurrence of an increase in loss and overheating of an element can be avoided. Conversely, at a high frequency, conductor coils 141 and 142 can be downsized. Further, noise generated when transmitting a high frequency signal can be suppressed, when compared with the case of switching on/off high voltage switching element 117 in the comparative example.

In addition, in magnetic coupling element 140, when a current is generated due to a voltage difference between one end and the other end of primary conductor coil 141, the same voltage difference as that in primary conductor coil 141 can be generated between one end and the other end of secondary conductor coil 142 through magnetic coupling. Therefore, unlike the comparative example, signal transmission can be performed by transmitting the output of drive circuit 110 to the input side of drive circuit 120 without depending on an exact difference between the potential of high voltage-side GND node Ng2 (GND2) and the potential of low voltage-side GND node Ng1 (GND1).

Consequently, according to semiconductor device 100 in accordance with the first embodiment, a stable signal transmission function can be secured, and power loss and noise during driving at a high frequency can be suppressed.

Variation of First Embodiment

Figure 7:
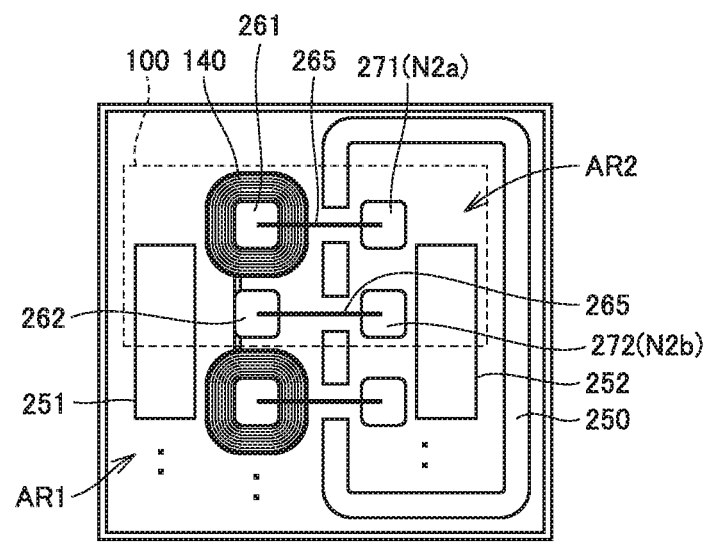
FIG. 7 is a schematic plan view for illustrating a configuration of a semiconductor device in accordance with a variation of the first embodiment.

FIG. 7 is a schematic plan view for illustrating a configuration of a semiconductor device in accordance with a variation of the first embodiment.

Referring to FIG. 7, the semiconductor device in accordance with the variation of the first embodiment is different from the semiconductor device in accordance with the first embodiment shown in FIG. 5 in that an on-chip wire 265 formed on the semiconductor substrate is arranged instead of conductor 260 formed of a wire or the like. As with conductor (wire) 260 in FIG. 5, on-chip wire 265 establishes electrical connection between conductor pads 261 and 271, and between conductor pads 262 and 272. Thereby, in FIG. 4, nodes N2a and N2b corresponding to one end and the other end of secondary conductor coil 142 of magnetic coupling element 140 are electrically connected with the input side of high voltage-side drive circuit 120. Since the configuration and the operation of other components of the semiconductor device in accordance with the variation of the first embodiment are the same as those of the semiconductor device in accordance with the first embodiment, detailed description will not be repeated.

For example, on-chip wire 265 can be arranged in a separation portion provided in breakdown voltage holding portion 250. On-chip wire 265 can have any wiring structure. For example, on-chip wire 265 can be provided as a multilayer wire routed through a plurality of wire layers from a central portion of conductor coil 142 of magnetic coupling element 140. On-chip wire 265 corresponds to one embodiment of a "conductor wire".

In the semiconductor device in accordance with the variation of the first embodiment, the step of arranging conductor 260 such as a wire on a chip is not required, and thus assembling property is improved when compared with the semiconductor device in accordance with the first embodiment.

Second Embodiment

A second embodiment will describe a power conversion system including the semiconductor device in accordance with the first embodiment or the variation thereof.

Figure 8:
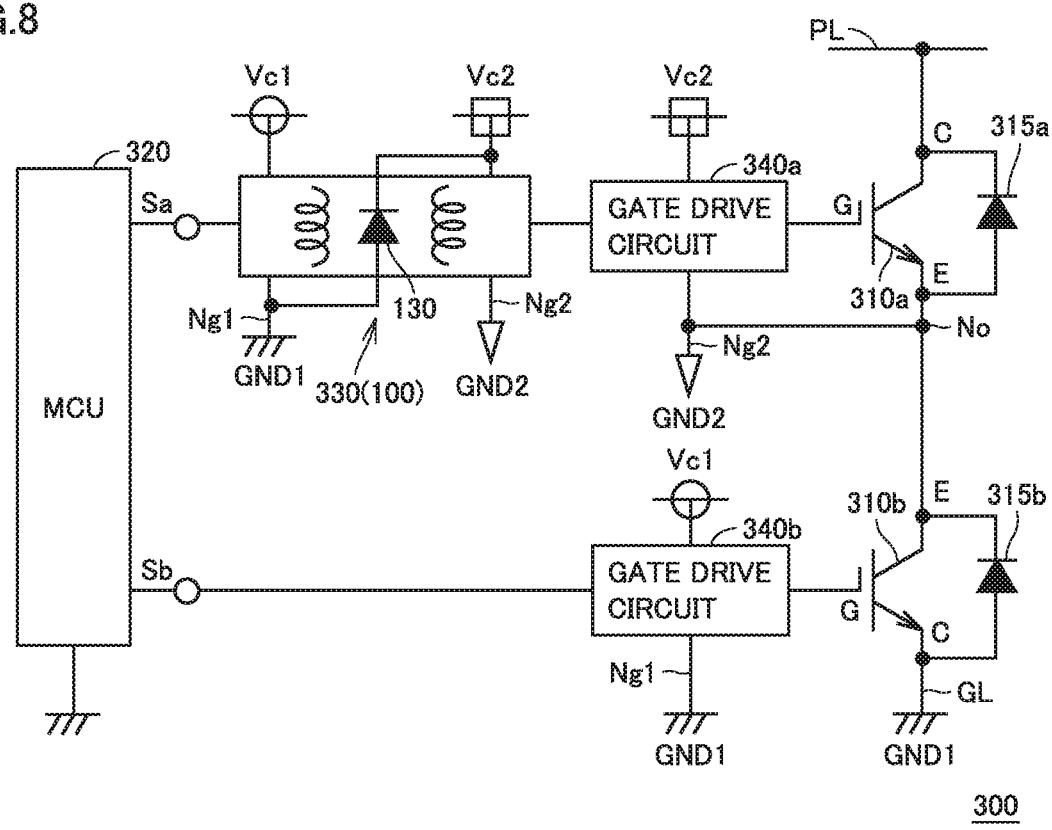
FIG. 8 is a block diagram showing a first exemplary configuration of a power conversion system in accordance with a second embodiment.

FIG. 8 is a block diagram showing a first exemplary configuration of a power conversion system in accordance with a second embodiment Referring to FIG. 8, a power conversion system 300 in accordance with the first exemplary configuration of the second embodiment includes semiconductor switching elements 310a and 310b, reflux diodes 315a and 315b, an MCU (Micro Control Unit) 320, a level shift circuit 330, and gate drive circuits 340a and 340b.

Semiconductor switching elements 310a and 310b are totem-pole connected, and are connected in series between a power supply line PL and a ground line GL, via a node No. Ground line GL is electrically connected with low voltage-side GND node Ng1, and both have the same potential. Reflux diodes 315a and 315b are connected in anti-parallel with semiconductor switching elements 310a and 310b. In the exemplary configuration of FIG. 8, semiconductor switching elements 310a and 310b are each constituted of an insulated gate bipolar transistor made of a Si semiconductor, namely, Si-IGBT. In addition, reflux diodes 315a and 315b are also each constituted of a diode made of Si.

Semiconductor switching element 310a corresponds to an upper arm, and semiconductor switching element 310b corresponds to a lower arm. By complementarily switching on/off semiconductor switching elements 310a and 310b, the potential of power supply line PL and the potential of ground line GL (GND1) are selectively output to node No. As is known, power conversion is controlled by controlling ON period ratios of upper arm semiconductor switching element 310a and lower arm semiconductor switching element 310b, or controlling an on/off frequency.

MCU 320 generates a control signal Sa for controlling switching on/off of semiconductor switching element 310a, and a control signal Sb for controlling switching on/off of semiconductor switching element 310b, for the control of such power conversion.

Each of semiconductor switching elements 310a and 310b has a positive electrode-side electrode, a negative electrode-side electrode, and a control electrode referred to as a gate. It should be noted that the positive electrode-side electrode is referred to as a collector in an IGBT, and is referred to as a drain in a FET. The negative electrode-side electrode is referred to as an emitter in the IGBT, and is referred to as a source in the FET. Each of semiconductor switching elements 310a and 310b is switched on/off according to a voltage of the control electrode relative to the negative electrode-side electrode, referred to as a gate voltage. Specifically, when the gate voltage is higher than a threshold voltage of each of semiconductor switching elements 310a and 310b, each of semiconductor switching elements 310a and 310b is switched on. In contrast, when the gate voltage is lower than the threshold voltage, each of semiconductor switching elements 310a and 310b is switched off. The gate voltages of semiconductor switching elements 310a and 310b are supplied from gate drive circuits 340a and 340b, respectively.

The emitter (negative electrode-side electrode) of lower arm semiconductor switching element 310b has the same potential as that of ground line GL, namely, that of low voltage-side GND node Ng1 (GND1). Thus, semiconductor switching element 310b can be switched on/off by the supply of a gate voltage based on GND1. Accordingly, gate drive circuit 340b operated by receiving GND1 and control power supply voltage Vc1 outputs a gate voltage according to control signal Sb from MCU 320, to the gate of semiconductor switching element 310b, and thereby switching on/off of semiconductor switching element 310b is controlled according to control signal Sb.

In contrast, the emitter (negative electrode-side electrode) of upper arm semiconductor switching element 310a is not connected with ground line GL, and its potential varies. Thus, gate drive circuit 340a has to supply a gate voltage based on high voltage-side GND node Ng2 (GND2) having the same potential as that of node No, to the gate of semiconductor switching element 310a. Accordingly, it is necessary to level-convert control signal Sa (Vc1/GND1) from MCU 320, to a signal in which GND2 is at an L level and Vc2 is at an H level.

In the second embodiment, the semiconductor device in accordance with the first embodiment or the variation thereof is applied to level shift circuit 330. That is, when control signal Sa from MCU 320 is input as control signal Sin to semiconductor device 100 in the first embodiment or the variation thereof, output signal Sout from semiconductor device 100 generated by level-converting control signal Sa is input to gate drive circuit 340a. Gate drive circuit 340a operated by receiving GND2 and control power supply voltage Vc2 outputs a gate voltage according to the output signal from level shift circuit 330 (semiconductor device 100), to the gate of semiconductor switching element 310a, and thereby switching on/off of semiconductor switching element 310a is controlled according to control signal Sa.

In this manner, in power conversion system 300 in accordance with the first exemplary configuration of the second embodiment, switching on/off of the upper arm (high voltage-side) of the totem-pole connected semiconductor switching elements can be stably controlled, using the signal transmission function involving insulation and level shift provided by semiconductor device 100 in the first embodiment or the variation thereof. In addition, power loss in level shift circuit 330 can be suppressed even when semiconductor switching elements 310a and 310b are switched on/off at a high frequency.

Figure 9:
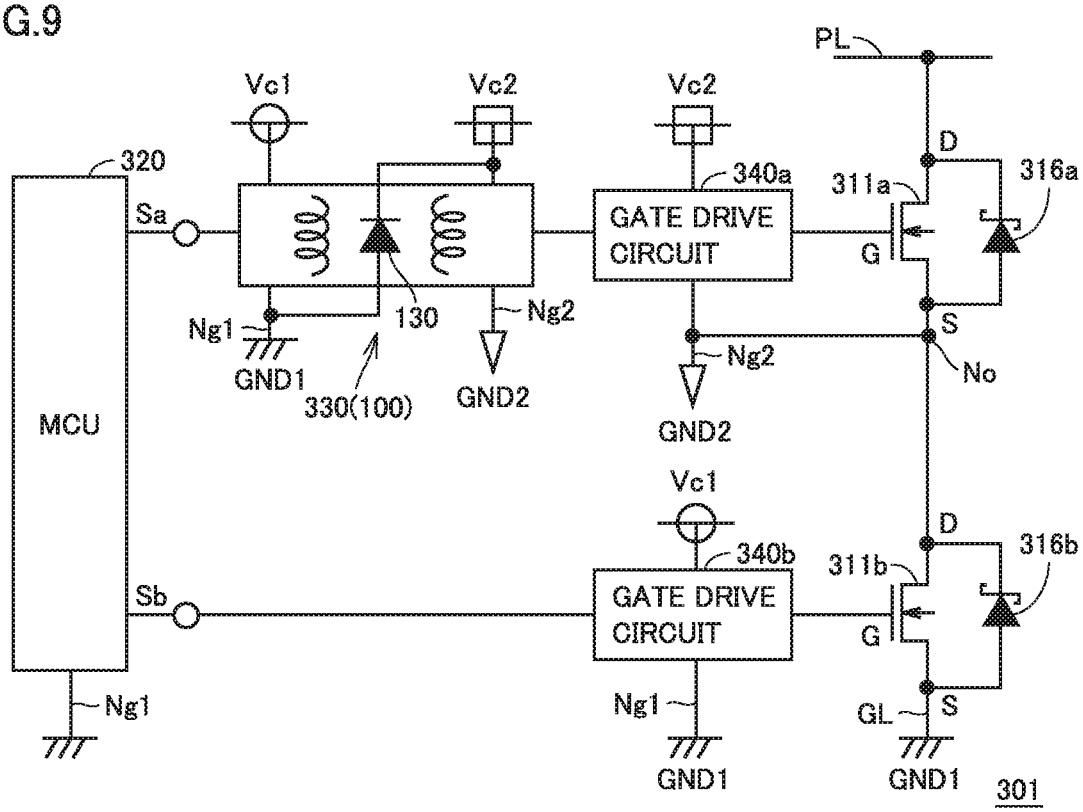
FIG. 9 is a block diagram showing a second exemplary configuration of the power conversion system in accordance with the second embodiment.

FIG. 9 is a block diagram showing a second exemplary configuration of the power conversion system in accordance with the second embodiment.

Referring to FIG. 9, a power conversion system 301 in accordance with the second exemplary configuration of the second embodiment is different from power conversion system 300 in accordance with the first exemplary configuration (FIG. 8) in that semiconductor switching elements 311a and 311b are arranged instead of semiconductor switching elements 310a and 310b, and reflux diodes 316a and 316b are arranged instead of reflux diodes 315a and 315b. Each of semiconductor switching elements 311a and 311b is constituted of a SiC-MOSFET, which is a field effect transistor made of SiC (silicon carbide). The SiC-MOSFET is known as an element having a low loss and a high breakdown voltage. Reflux diodes 316a and 316b connected in anti-parallel with semiconductor switching elements 311a and 311b are each constituted of a Schottky barrier diode made of SiC.

Since the configuration and the operation of other components of power conversion system 301 are the same as those of power conversion system 300, detailed description will not be repeated. That is, the configuration for supplying the gate voltages according to control signals Sa and Sb from MCU 320, to semiconductor switching elements 311a and 311b is in common with that of power conversion system 300.

Figure 10:
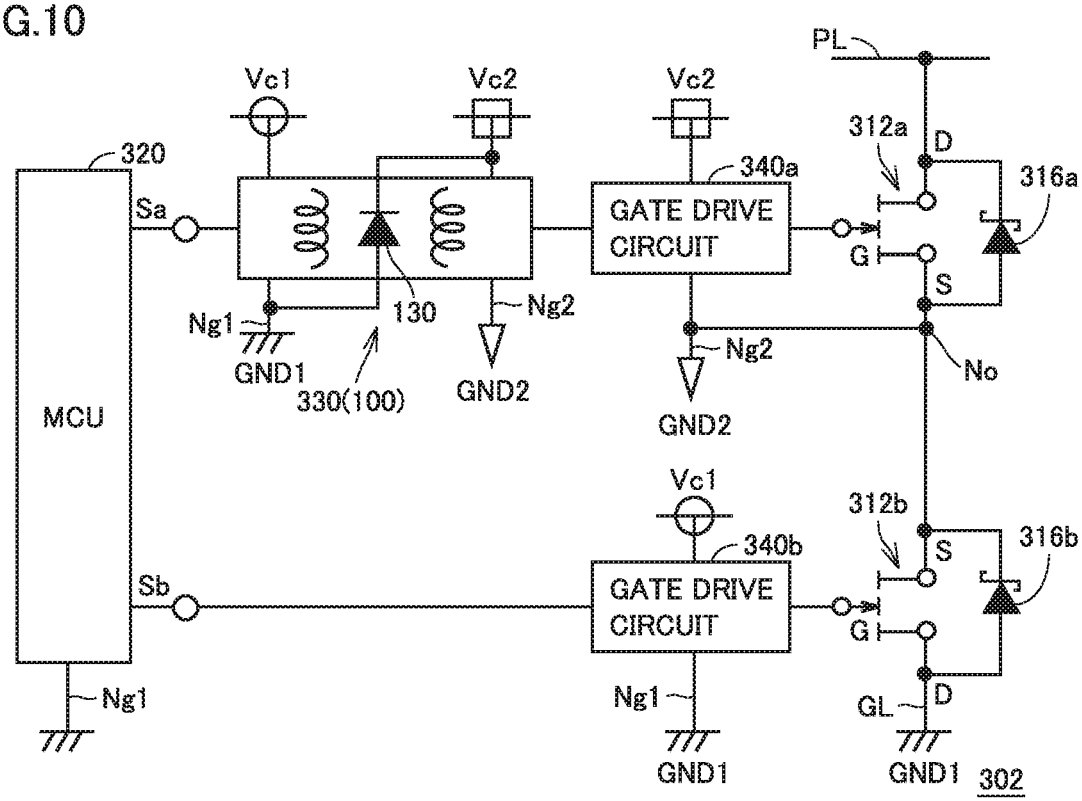
FIG. 10 is a block diagram showing a third exemplary configuration of the power conversion system in accordance with the second embodiment.

FIG. 10 is a block diagram showing a third exemplary configuration of the power conversion system in accordance with the second embodiment.

Referring to FIG. 10, a power conversion system 302 in accordance with the third exemplary configuration of the second embodiment is different from power conversion system 301 in accordance with the second exemplary configuration (FIG. 9) in that semiconductor switching elements 312a and 312b are arranged instead of semiconductor switching elements 311a and 311b. Each of semiconductor switching elements 312a and 312b is constituted of a high electron mobility transistor made of GaN (gallium nitride), namely, a GaN-HEMT. The GaN-HEMT is a type of FET, and is known as an element having a low loss and a high breakdown voltage.

Since the configuration and the operation of other components of power conversion system 302 are the same as those of power conversion systems 300 and 301, detailed description will not be repeated. That is, the configuration for supplying the gate voltages according to control signals Sa and Sb from MCU 320, to semiconductor switching elements 312a and 312b is common in power conversion systems 300 to 302.

In this manner, also in power conversion systems 301 and 302 in accordance with the second and third exemplary configurations of the second embodiment, the gate voltages can be supplied by the configuration which is in common with that of power conversion system 300 configured to switch on/off the semiconductor switching elements made of Si. Generally, a SiC-MOSFET and a GaN-HEMT are often used at a high frequency, and thus there may occur an increase in power loss and noise in a level shift circuit. However, in power conversion systems 301 and 302 in accordance with the second embodiment, a stable operation and a low loss at a higher frequency can be achieved by applying semiconductor device 100 using magnetic coupling element 140 to level shift circuit 330. In particular, since it is not necessary to decrease a switching frequency to avoid malfunction of the level shift circuit used at a higher frequency, characteristics of the SiC-MOSFET and the GaN-HEMT can be effectively utilized.

It should be noted that the configuration of the power conversion system described in the second embodiment is merely exemplary, and semiconductor device 100 in accordance with the first embodiment or the variation thereof is applicable to drive the gate of a semiconductor switching element, without limiting the circuit configuration of the power conversion system in particular. That is, it is described for confirmation that application of semiconductor device 100 is not limited to driving of the gate of the totem-pole connected upper arm semiconductor switching element Semiconductor device 100 is not limited to be applied to a power conversion system, but is also applicable to any apparatus or system which requires a signal transmission function involving insulation and level shift.

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A semiconductor device formed on a semiconductor substrate, comprising:
a first signal output circuit connected with a first power supply node and a first ground node;
a second signal output circuit connected with a second power supply node electrically separated from the first power supply node, and a second ground node electrically separated from the first ground node;
a PN junction portion formed of a P type part electrically connected with the first ground node, and an N type part electrically connected with the second power supply node; and
a magnetic coupling element having a first conductor coil and a second conductor coil which are magnetically coupled,
the first conductor coil being electrically connected with an output side of the first signal output circuit,
the second conductor coil being electrically connected with an input side of the second signal output circuit.

2. The semiconductor device according to claim 1, wherein
a high voltage region and a low voltage region separated by a breakdown voltage holding portion formed of an insulator are provided in a main surface of the semiconductor substrate,
the low voltage region has
a first N type region electrically connected with the first power supply node, and
a first P type region electrically connected with the first ground node, the high voltage region has
a second N type region electrically connected with the second power supply node, and
a second P type region electrically connected with the second ground node,
the first signal output circuit and the magnetic coupling element are formed in the low voltage region, and
the second signal output circuit is formed in the high voltage region.

3. The semiconductor device according to claim 1, wherein the second conductor coil is electrically connected with the input side of the second signal output circuit by a wire.

4. The semiconductor device according to claim 2, wherein the second conductor coil is electrically connected with the input side of the second signal output circuit by a wire.

5. The semiconductor device according to claim 1, wherein the second conductor coil is electrically connected with the input side of the second signal output circuit by a conductor wire formed in an upper wire layer of the semiconductor substrate.

6. The semiconductor device according to claim 2, wherein the second conductor coil is electrically connected with the input side of the second signal output circuit by a conductor wire formed in an upper wire layer of the semiconductor substrate.

7. A power conversion system comprising:
a semiconductor switching element switched on/off according to a gate voltage,
a control circuit configured to generate a control signal for controlling switching on/off of the semiconductor switching element;
a level shift circuit constituted of the semiconductor device according to claim 1; and
a gate drive circuit connected with the second power supply node and the second ground node for supplying the gate voltage of the semiconductor switching element,
the first signal output circuit being configured to receive the control signal and output a signal according to the control signal, the gate drive circuit being configured to supply the gate voltage according to an output signal of the second signal output circuit.

8. The power conversion system according to claim 7, wherein the semiconductor switching element is constituted of an insulated gate bipolar transistor made of silicon, a field effect transistor made of silicon carbide, or a high electron mobility transistor made of gallium nitride.

9. The power conversion system according to claim 7, wherein the semiconductor switching element is an upper arm-side semiconductor switching element, of a plurality of semiconductor switching elements connected in series between a power supply line and a ground line.

10. The power conversion system according to claim 8, wherein the semiconductor switching element is an upper arm-side semiconductor switching element, of a plurality of semiconductor switching elements connected in series between a power supply line and a ground line.

* * * * *